United States Patent
Prevost

(10) Patent No.: US 9,800,238 B2
(45) Date of Patent: *Oct. 24, 2017

(54) RF SWITCH WITH BYPASS TOPOLOGY

(71) Applicant: Peregrine Semiconductor Corporation, San Diego, CA (US)

(72) Inventor: Ethan Prevost, Poway, CA (US)

(73) Assignee: Peregrine Semiconductor Corporation, San Diego, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 15/426,848

(22) Filed: Feb. 7, 2017

(65) Prior Publication Data

US 2017/0149429 A1    May 25, 2017

Related U.S. Application Data

(63) Continuation of application No. 14/811,159, filed on Jul. 28, 2015, now Pat. No. 9,602,098.

(51) Int. Cl.
*H03K 17/16* (2006.01)
*H03K 17/30* (2006.01)

(52) U.S. Cl.
CPC ................................. *H03K 17/165* (2013.01)

(58) Field of Classification Search
CPC .................................................... H03K 17/165
USPC ........................................................ 327/379
See application file for complete search history.

(56) References Cited

U.S. PATENT DOCUMENTS

| | | | |
|---|---|---|---|
| 9,602,098 B2 * | 3/2017 | Prevost | ............... H03K 17/165 |
| 2009/0207764 A1 | 8/2009 | Fukamachi et al. | |
| 2013/0200710 A1 | 8/2013 | Robbins | |
| 2015/0055733 A1 | 2/2015 | Asano et al. | |
| 2015/0145614 A1 | 5/2015 | Whitefield et al. | |
| 2016/0056774 A1 | 2/2016 | Ilkov et al. | |
| 2017/0033786 A1 | 2/2017 | Prevost | |

FOREIGN PATENT DOCUMENTS

WO    2017019412    2/2017

OTHER PUBLICATIONS

Retebo, Metasebia T., Office Action received from the USPTO dated Sep. 20, 2016 for U.S. Appl. No. 14/811,159, 7 pgs.
Retebo, Metasebia T., Notice of Allowance received from the USPTO dated Dec. 12, 2016 for U.S. Appl. No. 14/811,159, 8 pgs.
Prevost, Ethan, Response filed in the USPTO dated Oct. 28, 2016 for U.S. Appl. No. 14/811,159, 13 pgs.

(Continued)

*Primary Examiner* — Lincoln Donovan
*Assistant Examiner* — Metasebia Retebo
(74) *Attorney, Agent, or Firm* — Jaquez Land Greenhaus LLP; Martin J. Jaquez, Esq.; John Land, Esq.

(57) ABSTRACT

An RF signal switch circuit that allows connection of any of N radio frequency (RF) input terminals to a switch output port, either in an in-circuit mode or in a bypass mode. Embodiments of the invention allow for both a single switch in the series input path while still having the ability to isolate the bypass path from an input matching network. In both modes, the circuit simultaneously exhibits low input insertion loss (and thus a low noise factor) and high bypass mode isolation.

22 Claims, 7 Drawing Sheets

(56) References Cited

OTHER PUBLICATIONS

Lindberg, Per, International Search Report and Written Opinion received from the EPO dated Oct. 27, 2016 for appln. No. PCT/US2016/043171, 10 pgs.

Peregrine Semiconductor Corporation, Demand and Response filed in the EPO dated Mar. 23, 2017 for appln. No. PCT/US2016/043171, 22 pgs.

Toscano, Oliveros L., International Preliminary Report on Patentability received from the EPO dated Jul. 10, 2017 for appln. No. PCT/2016/043171, 21 pgs.

\* cited by examiner

Low Input IL, Low Isolation

High Input IL, High Isolation

Low Input IL, High Isolation

In-circuit Mode

Bypass Mode

Alternative Bypass Circuit

RF SWITCH WITH BYPASS TOPOLOGY

CROSS-REFERENCE TO RELATED APPLICATION—CLAIM OF PRIORITY

This patent application is a continuation application of U.S. patent application Ser. No. 14/811,159 filed Jul. 28, 2015 entitled "RF Switch with Bypass Topology", the disclosure of which is incorporated herein by reference in its entirety.

BACKGROUND (1) Technical Field

This invention relates to electronic radio frequency (RF) circuits, and more particularly to RF signal switching circuits.

(2) Background

Radio frequency (RF) signal switches are common circuits for routing RF signals between various parts of an RF system, such as between one or more antennas and one or more transmitter and/or receiver circuits. For example, RF signal switches are used in such devices as one-way and two-way radios, including cellular telephones, and in global positioning system (GPS) devices.

It is fairly common to use RF signal switches in electronic systems that are sensitive to noise, such as radio signal receivers. Such receivers are often presented with very weak signals (for example, transmitted radio waves captured by an antenna), and accordingly, it is common to use a low-noise amplifier (LNA) to amplify such signals. It is also common to provide a matching network at the input of the LNA to maximize power transfer to the LNA.

The noise figure (NF) of a low noise amplifier (LNA) is very sensitive to the impedance presented and the insertion loss (IL) in front of the input to the LNA. For example, in a typical cellular radio LNA configuration, a set of bandpass filters in series with an RF switch exist at the input of the LNA and are used to select a specific band to be presented to a radio transceiver. In order to reduce the NF, RF signal switches with low insertion loss (IL) are required. However, in some modes of operation, the LNA must be bypassable, and in such a mode, the LNA should be isolated from the bypass signal path.

For example, FIG. 1 is a schematic diagram of a prior art RF signal switch 100 in which one of N RF input terminals $RF_1$-$RF_N$ may be connected to a Switch Output port, either through a matching network and LNA block 102 or through a bypass path 104. The RF input terminals $RF_1$-$RF_N$ may be connected to respective antennas; the matching network and LNA block 102 are generally external to the RF signal switch 100, as indicated by the dashed lines.

In the illustrated example, in an "in-circuit" mode, the input terminal $RF_1$ may be connected to the matching network and LNA block 102 by closing the corresponding series switch $S_1$, opening a corresponding shunt switch $Sh_1$, opening the Bypass Switch, closing an output connector switch $S_C$, and opening an output connector shunt switch $Sh_C$. In this mode, for each other RF input terminal $RF_2$-$RF_N$, the corresponding series switch $S_2$-$S_N$ is open and the corresponding shunt switch $S_2$-$S_N$ is closed. Any other RF input terminal $RF_2$-$RF_N$ may be connected in-circuit to the matching network and LNA block 102 in a similar manner.

In a bypass mode, the input terminal $RF_1$ may be connected directly to the Switch Output by closing the corresponding series switch $S_1$, opening the corresponding shunt switch $Sh_1$, closing the Bypass Switch, opening the output connector switch $S_C$, and closing the output connector shunt switch $Sh_C$. In this mode, for each other RF input terminal $RF_2$-$RF_N$, the corresponding series switch $S_2$-$S_N$ is open and the corresponding shunt switch $S_2$-$S_N$ is closed. Any other RF input terminal $RF_2$-$RF_N$ may be connected to bypass the matching network and LNA block 102 in a similar manner.

A problem with the circuit configuration shown in FIG. 1 is that the matching network at the input of the LNA is not isolated from the bypass path 104 when the LNA is not active. The matching network can adversely affect the output impedance of the RF signal switch 100 and cause the IL of the bypass path 104 to be degraded, the severity of which is dependent on the design and component values of the LNA input matching network. This degradation of the bypass path IL causes module designers to struggle to find a balance between having a good LNA input match and maintaining a low bypass path IL.

If it is desired to isolate the bypass path from the LNA input matching network, standard practice is to add another series/shunt switch pair before the matching network. For example, FIG. 2 is a schematic diagram of the prior art RF signal switch of FIG. 1 in which an isolation series/shunt switch pair $S_I$/$Sh_I$ 106 are Connected Before the Matching Network and LNA block 102. In the bypass mode, the isolation series switch $S_I$ is open and the isolation shunt switch $Sh_I$ is closed, thereby coupling the matching network input to circuit ground and completely isolating the matching network from the bypass path 104. Conversely, in the in-circuit mode, the isolation series switch $S_I$ is closed and the isolation shunt switch $Sh_I$ is open.

However, a downside of the circuit configuration shown in FIG. 2 is that the added series switch $S_I$ increases the input IL to the LNA compared to the configuration shown in FIG. 1, and thus increases the system NF. This is so because the illustrated switches are not perfect conductors when closed, but exhibit some amount of impedance.

Accordingly, there is a need for an RF signal switching circuit that simultaneously exhibits low input IL (and thus a low NF) and high isolation. The present invention addresses this need.

SUMMARY OF THE INVENTION

The invention encompasses embodiments of an RF signal switch circuit that allows connection of any of N RF input terminals $RF_1$-$RF_N$ to a Switch Output port, either in an in-circuit mode or in a bypass mode. Embodiments of the invention allow for both a single switch in the series input path while still having the ability to isolate the bypass path from an input matching network. In both modes, the circuit simultaneously exhibits low input IL (and thus a low NF) and high bypass mode isolation.

In one embodiment, an in-circuit path of the RF signal switch circuit is coupled to the input of an isolation and/or insertion loss sensitive target circuit (such as an LNA or a digital step attenuator) that may include an optional matching network. The target circuit and the optional matching network are typically off-circuit with respect to the RF signal switch circuit, but the entire circuit may be fabricated as a hybrid or monolithic structure. In some embodiments, the matching network may be integrated with the target circuit.

In one embodiment, each of the RF input terminals $RF_1$-$RF_N$ is directly connected to three corresponding switches: an in-path connector switch $IC\_S_x$, a shunt switch $Sh_x$, and a bypass switch $BP\_S_x$ (where "x" represents the corresponding RF input terminal identifier, from 1 to N, and where N may be 1). For each of the RF input terminals $RF_1$-$RF_N$, all of the in-path connector switches IC_$S_x$ and an isolation shunt switch $Sh_I$ are connected to an in-circuit path. In alternative embodiments, each of the RF input terminals $RF_1$-$RF_N$ may have one or more sets of in-path connector switch IC_$S_x$, and corresponding isolation shunt switches $Sh_I$ connected to parallel in-circuit paths. Such a configuration would, for example, allow multiple antennas to be selectively coupled to multiple target circuits without increasing the number of series switches to any one target circuit.

The output of the target circuit is connected to a switch return path, which is in turn selectively connectable to the Switch Output of the RF signal switch circuit through an output connector series switch $S_C$, or to circuit ground through an output connector shunt switch $Sh_C$.

In operation, an RF signal applied to any of the RF input terminals $RF_1$-$RF_N$ may be connected to the target circuit through a single switch (and then to the Switch Output), or applied to a bypass path to the Switch Output with complete isolation of any matching network coupled to the switching circuit.

The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements.

DETAILED DESCRIPTION OF THE INVENTION

Figure 3:
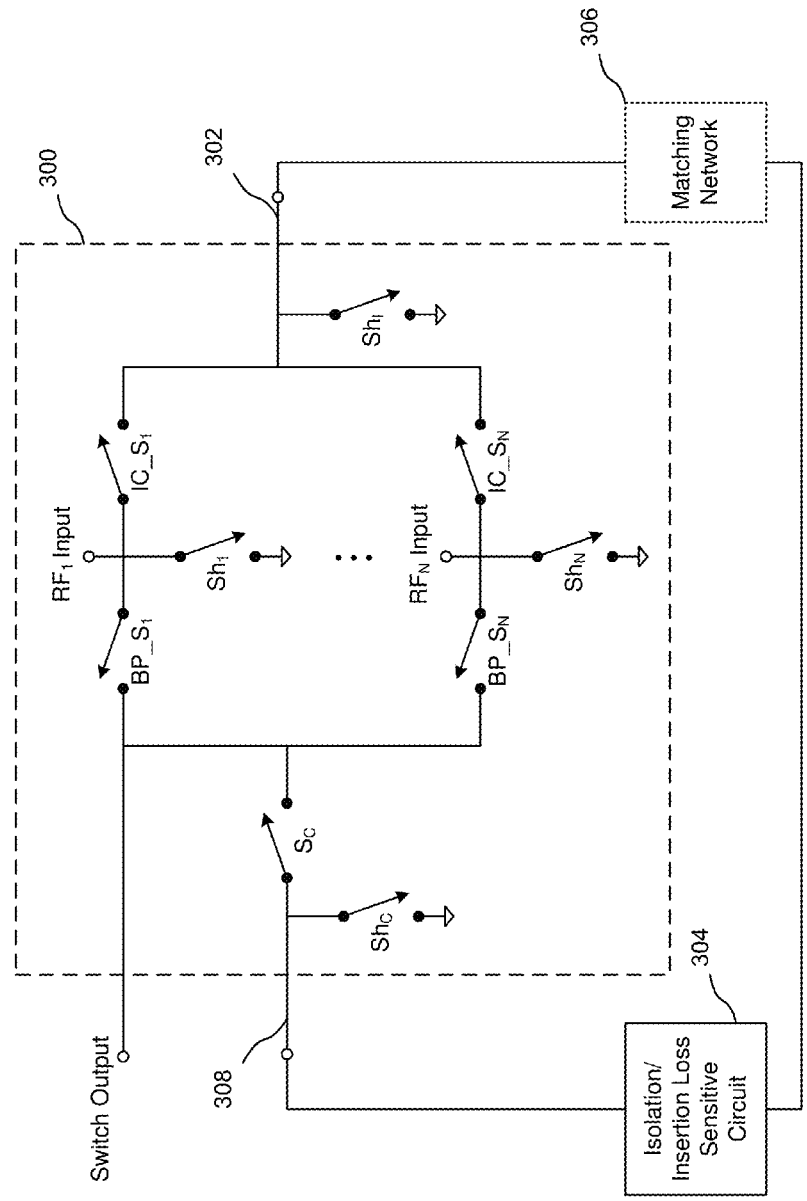
FIG. 3 is a schematic diagram of an embodiment of an RF signal switch circuit in accordance with the present invention.

FIG. 3 is a schematic diagram of an embodiment of an RF signal switch circuit 300 in accordance with the present invention. The RF signal switch circuit 300 allows connection of any of N RF input terminals $RF_1$-$RF_N$ to a Switch Output port, either in an in-circuit mode or in a bypass mode. Embodiments of the invention allow for both a single switch in the series input path while still having the ability to isolate the bypass path from an input matching network. In both modes, the circuit simultaneously exhibits low input IL (and thus a low NF) and high bypass mode isolation.

In the illustrated embodiment, an in-circuit path 302 of the RF signal switch circuit 300 is configured to be coupled to the input of an isolation and/or insertion loss sensitive target circuit 304 (such as an LNA or a digital step attenuator) directly or through an optional matching network 306 (shown in dotted outline). The target circuit 304 and the matching network 306 are typically off-circuit with respect to the RF signal switch circuit 300, but the entire circuit illustrated in FIG. 3 may be fabricated as a hybrid or monolithic structure. In some embodiments, the matching network 306 may be integrated with the target circuit 304. However, for convenience, the description below will treat the target circuit 304 and the matching network 306 as separate elements.

In the illustrated embodiment, each of the RF input terminals $RF_1$-$RF_N$ is directly connected to three corresponding switches: an in-path connector switch IC_$S_x$, a shunt switch $Sh_x$, and a bypass switch BP_$S_x$ (where "x" represents the corresponding RF input terminal identifier, from 1 to N, and where N may be 1). For each of the RF input terminals $RF_1$-$RF_N$, all of the in-path connector switches IC_$S_x$ and an isolation shunt switch $Sh_I$ are connected to the in-circuit path 302.

The RF signal switch includes a switch return path 308 configured to be coupled to the output of the target circuit 304. The switch return path 308 is in turn selectively connectable to the Switch Output of the RF signal switch circuit 300 through an output connector series switch $S_C$, or to circuit ground through an output connector shunt switch $Sh_C$.

In alternative embodiments, the RF input terminals $RF_1$-$RF_N$ may have one or more sets of in-path connector switch IC_$S_x$, and corresponding isolation shunt switches $Sh_I$ connected to parallel in-circuit paths 302. Such a configuration would, for example, allow multiple antennas to be selectively coupled to multiple target circuits 304 without increasing the number of series switches to any one target circuit 304. In such a configuration, the RF signal switch 300 would have parallel switch return paths 308, each configured to be coupled to a corresponding target circuit 304, a corresponding output connector series switch $S_C$, and a corresponding output connector shunt switch $Sh_C$.

All of the switches described above for FIG. 3 may be controlled by external switching circuitry (not shown) of conventional design to set either open states or closed states for the switches.

Figure 4A:
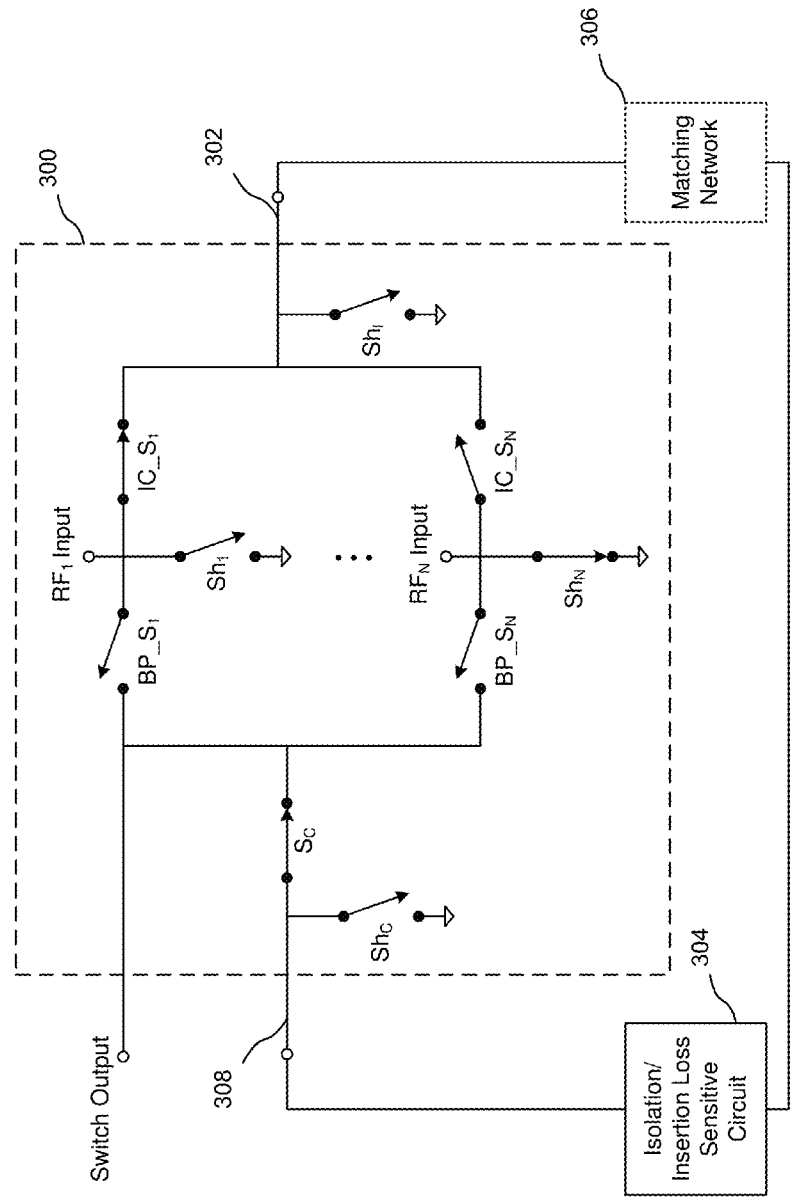
FIG. 4A is a schematic diagram of the embodiment shown in FIG. 3 configured in an in-circuit mode.

FIG. 4A is a schematic diagram of the embodiment shown in FIG. 3 configured in an in-circuit mode. In this example, a signal applied to RF input terminal $RF_1$ is coupled through the closed in-path connector switch IC_$S_1$ to the in-circuit path 302, through the matching network 306 to the target circuit 304, back to the switch return path 308 and through the closed output connector series switch $S_C$, and then to the Switch Output. The shunt switch $Sh_1$ and the bypass switch BP_$S_1$ for the RF input terminal $RF_1$ are open, as are the isolation shunt switch $Sh_I$ and the output connector shunt switch $Sh_C$.

Each of the other RF input terminals $RF_2$-$RF_N$ are shunted to circuit ground through their corresponding shunt switch $Sh_2$-$Sh_N$, and their corresponding in-path connector switches IC_$S_2$ to IC_$S_N$ and bypass switches BP_$S_2$ to BP_S$_N$ are open, thus isolating the RF input terminals RF$_2$-RF$_N$ from the active signal path through RF input terminal RF$_1$.

In the configuration shown in FIG. 4A, the input signal at the RF input terminal RF$_1$ passes through only one switch (IC_S$_1$) before being coupled to the matching network 306, thus minimizing insertion loss to the matching network 306 and target circuit 304.

Figure 4B:
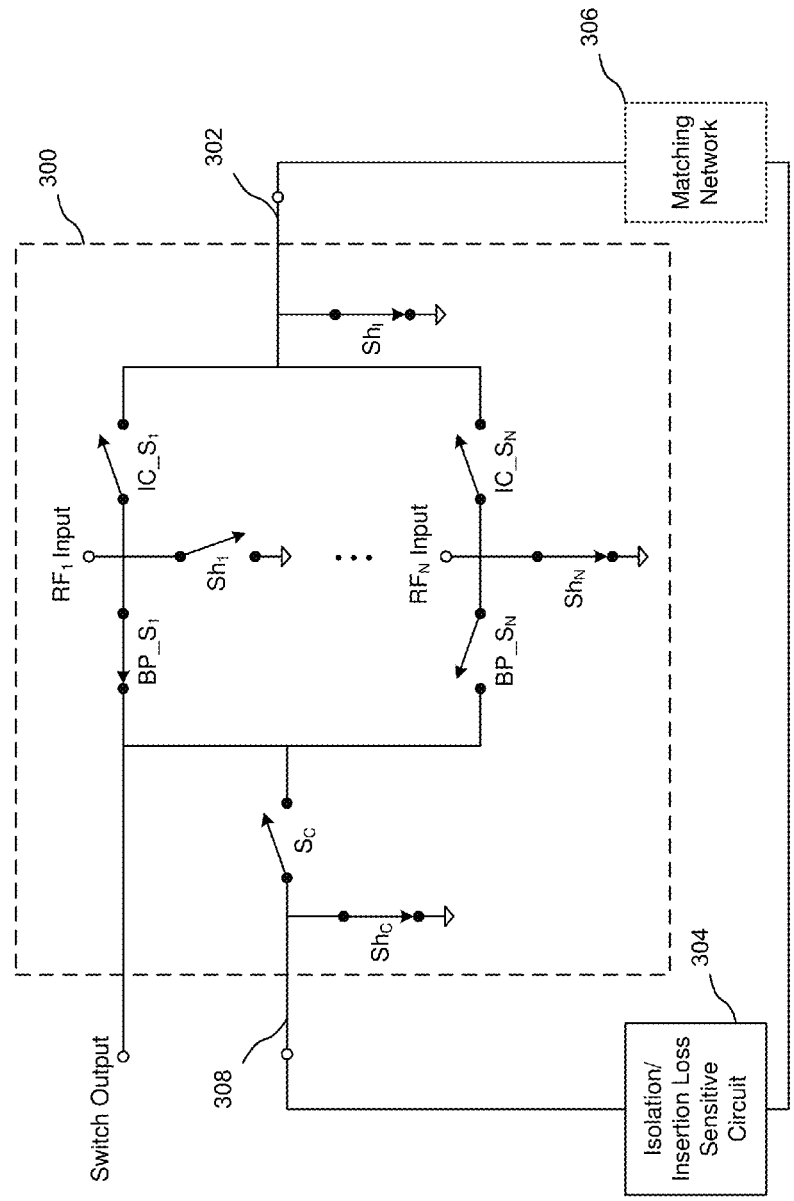
FIG. 4B is a schematic diagram of the embodiment shown in FIG. 3 configured in a bypass mode.

FIG. 4B is a schematic diagram of the embodiment shown in FIG. 3 configured in a bypass mode. In this example, a signal applied to RF input terminal RF$_1$ is coupled through the closed bypass switch BP_S$_1$ to the Switch Output. The shunt switch Sh$_1$ and the in-path connector switch IC_S$_1$ for the RF input terminal RF$_1$ are open. The isolation shunt switch Sh$_I$ and the output connector shunt switch Sh$_C$ are both closed, thereby coupling the input to the matching network 306 and the output of the target circuit 304 to circuit ground.

Each of the other RF input terminals RF$_2$-RF$_N$ are again shunted to circuit ground through their corresponding shunt switch Sh$_2$-Sh$_N$, and their corresponding in-path connector switches IC_S$_2$ to IC_S$_N$ and bypass switches BP_S$_2$ to BP_S$_N$ are open, thus isolating the RF input terminals RF$_2$-RF$_N$ from the active signal path through RF input terminal RF$_1$.

In the configuration shown in FIG. 4B, the input signal at the RF input terminal RF$_1$ passes through only one switch (BP_S$_1$) before being coupled to the Switch Output, and is completely isolated from the matching network 306 and the target circuit 304.

As should be clear, any other RF input terminal RF$_2$-RF$_N$ may be connected in an in-circuit mode or in a bypass mode in a similar manner. In the case of multiple target circuits 304, each inactive target circuit 304 would be isolated by appropriate settings of the shunt and series switches of the corresponding in-circuit path 302 and switch return path 308 (for example, by opening the corresponding in-path connector switch IC_S$_x$, closing the corresponding isolation shunt switch Sh$_I$, opening the corresponding output connector series switch S$_C$, and closing the corresponding output connector shunt switch Sh$_C$).

Alternative Bypass Switch Circuit

For the example shown in FIG. 3, if even higher isolation of the Switch Output from the input of the target circuit 304 is desired, the corresponding bypass switches BP_S$_1$ to BP_S$_N$ may be replaced by a "T" type series/shunt/series circuit bypass switch configuration. This may be useful to better isolate the Switch Output from the input of the target circuit 304, since a single bypass switch BP_S$_1$ (particularly one implemented as a field effect transistor) may behave as a capacitor capable of passing some amplified signal frequencies present on the Switch Output over to the input of the target circuit 304. Better isolation will prevent feedback and increase the stability of the target circuit 304. However, if the target circuit 304 does not provide amplification (e.g., if the target circuit is a digital step attenuator), then the simpler single-switch bypass switches BP_S$_1$ to BP_S$_N$ shown in FIG. 3 may be preferred.

Figure 5:
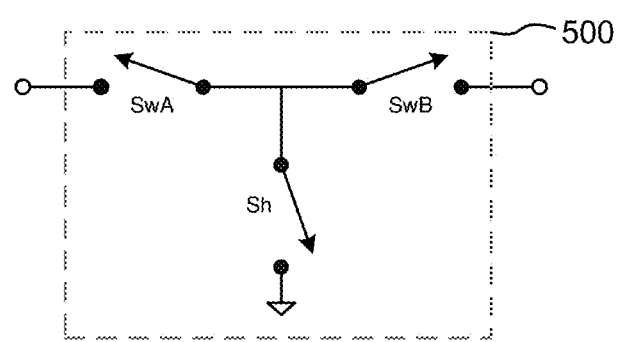
FIG. 5 is a schematic diagram of a high-isolation "T" type series/shunt/series bypass switch replacement circuit for each of the bypass switches BP_$S_1$ to BP_$S_N$ shown in FIG. 3.

FIG. 5 is a schematic diagram of a high-isolation "T" type series/shunt/series bypass switch replacement circuit 500 for each of the bypass switches BP_S$_1$ to BP_S$_N$ shown in FIG. 3. For an active signal path (e.g., for a signal applied to RF input terminal RF$_1$) in the bypass mode, series switch SwA is closed, series switch SwB is closed, and shunt switch Sh is open, thus allowing signal propagation from the RF input terminal RF$_1$ to the Switch Output (but with slightly worse bypass path IL because of the addition of a second series switch compared to the single-switch bypass switches BP_S$_1$ to BP_S$_N$ shown in FIG. 3).

For an active signal path in the in-circuit mode and for inactive signal paths in either mode, series switch SwA is open, series switch SwB is open, and shunt switch Sh is closed, thus grounding the junction between the two series switches SwA, SwB and thereby significantly increasing the isolation of the input to the target circuit 304 from the Switch Output.

Simulation Results

Figure 1:
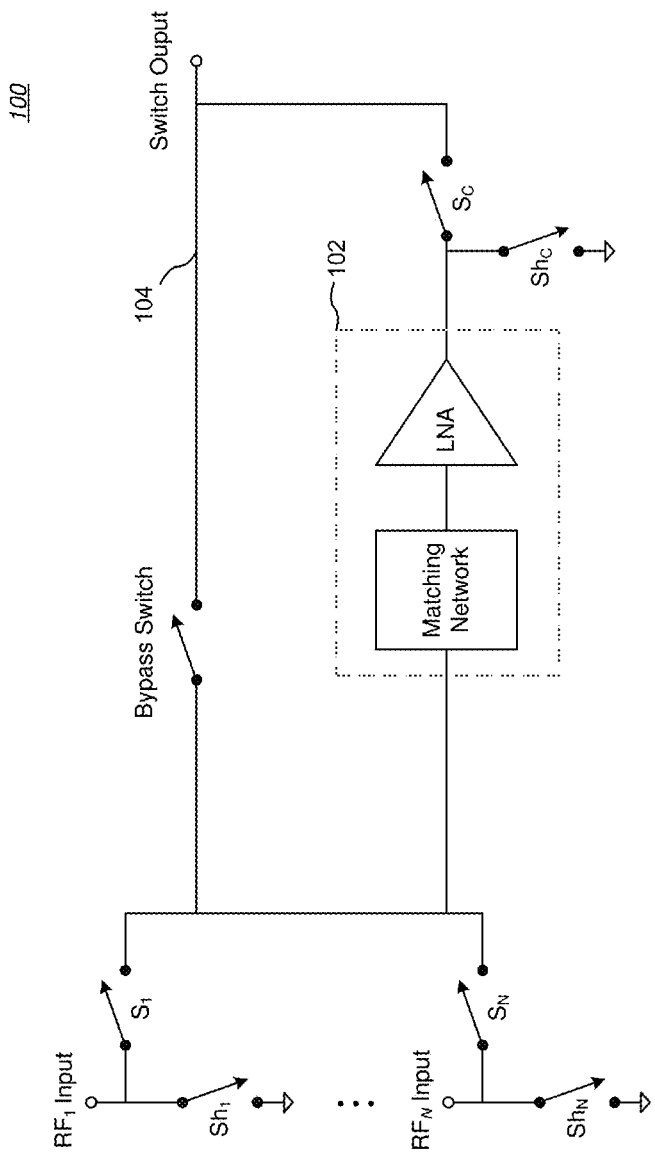
FIG. 1 is a schematic diagram of a prior art RF signal switch in which one of N RF input terminals $RF_1$-$RF_N$ may be connected to a Switch Output either through a matching network and LNA block, or through a bypass path.
Figure 2:
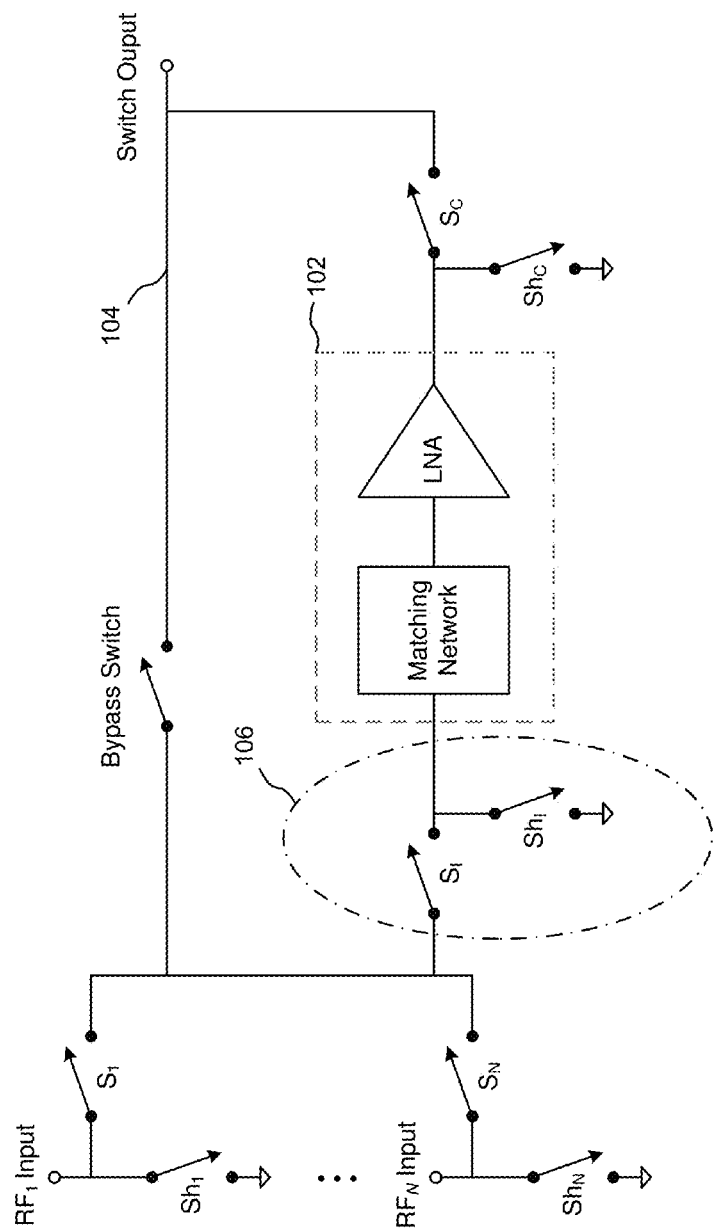
FIG. 2 is a schematic diagram of the prior art RF signal switch of FIG. 1 in which an isolation series/shunt switch pair $S_I$/$Sh_I$ is connected before the matching network and LNA block.

The two circuit topologies shown in FIG. 1 and FIG. 2 and the novel circuit topology shown in FIG. 3 were simulated for comparison using selected resistors, capacitors, inductors, and the scattering parameters (S-parameters) of a selected LNA. Since FET switches are known to behave as capacitors when open (non-conducting) and resistors when closed (conducting), in the simulation capacitors were used to represent open switches and resistors were used to represent closed switches. The capacitive and resistive values were chosen based on current RF switch IC technology. The inductors were used on the port locations to simulate an expected exterior matching network. The S-parameters were measured on a typical LNA (turned off) with an adjoining matching network that could be used in conjunction with such switches. This was done to introduce the effect the turned-off LNA with input matching network would have if its input was not properly isolated from the bypass path. The bypass switch was simulated using the high-isolation series/shunt/series configuration shown in FIG. 5.

Figure 6A:
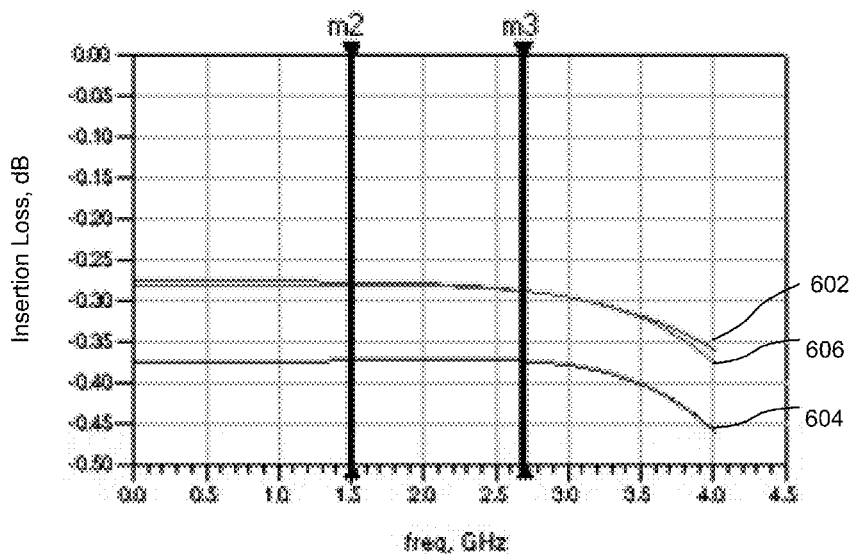
FIG. 6A is a graph comparing the insertion loss of the series input path to the LNA versus frequency for each of the three simulated circuit topologies from FIG. 1, FIG. 2, and FIG. 3.

FIG. 6A is a graph 600 comparing frequency versus the insertion loss of the series input path to the LNA for each of the three simulated circuit topologies from FIG. 1 (curve 602), FIG. 2 (curve 604), and FIG. 3 (curve 606). Point m2 represents a frequency of about 1.5 GHz, and point m3 represents a frequency of about 2.69 GHz. The FIG. 1 (curve 602) and FIG. 3 (curve 606) circuit topologies have similar IL performance, but the FIG. 2 (curve 604) circuit topology (with better isolation than the FIG. 1 circuit topology) has degraded IL due to the addition of a second switch in the series input path.

Figure 6B:
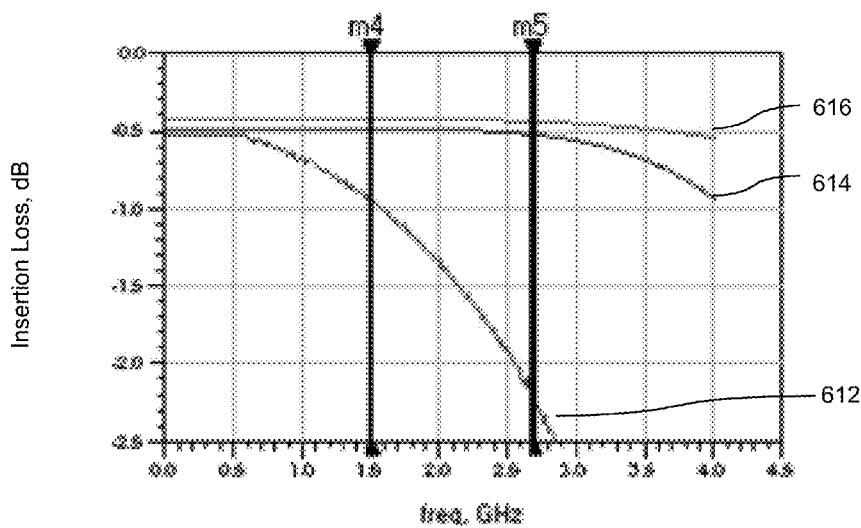
FIG. 6B is a graph comparing the insertion loss of the bypass path versus frequency for each of the three simulated circuit topologies from FIG. 1, FIG. 2, and FIG. 3.

FIG. 6B is a graph 610 comparing frequency versus the insertion loss of the bypass path for each of the three simulated circuit topologies from FIG. 1 (curve 612), FIG. 2 (curve 614), and FIG. 3 (curve 616). Point m4 represents a frequency of about 1.5 GHz, and point m5 represents a frequency of about 2.69 GHz. In contrast to the FIG. 6A results, the FIG. 2 (curve 614) and FIG. 3 (curve 616) circuit topologies have similar IL performance, with the FIG. 3 (curve 616) circuit topology being a little better at all frequencies, and significantly better at higher frequencies. The adverse effect of a non-isolated LNA (turned off) can be seen in the bypass IL of the FIG. 1 (curve 612) circuit topology, which worsens rapidly as frequency increases. In all simulations, the input series IL was optimized by using only an inductor for the input matching network; the severity of the degraded IL in the bypass path is very much dependent on the type of input matching network used. A different matching network circuitry could cause an even greater amount of IL degradation for the FIG. 1 (curve 612) circuit topology.

Comparing FIG. 6A and FIG. 6B, it is quite apparent that the novel circuit topology shown in FIG. 3 (curves 606, 616) has better overall IL performance than the circuit topologies of FIG. 1 (curves 602, 612) and of FIG. 2 (curves 604, 614) with their attendant tradeoff between bypass IL and input series IL.

As should be readily apparent to one of ordinary skill in the art, various embodiments of the invention can be implemented to meet a wide variety of specifications. Thus, selection of suitable component values are a matter of design choice. In particular, the switches shown in FIGS. 3-5 may be of any type, but are beneficially fabricated as field effect transistors (FETs) on an integrated circuit (IC). Various embodiments of the invention may be implemented in any suitable IC technology (including but not limited to MOS-FET and IFGET structures), or in hybrid or discrete circuit forms. Integrated circuit embodiments may be fabricated using any suitable substrates and processes, including but not limited to standard bulk silicon, silicon-on-insulator (SOI), silicon-on-sapphire (SOS), GaAs pHEMT, and MES-FET processes. Voltage levels may be adjusted or voltage polarities reversed depending on a particular specification and/or implementing technology (e.g., NMOS, PMOS, or CMOS). Component voltage, current, and power handling capabilities may be adapted as needed, for example, by adjusting device sizes, "stacking" components to handle greater voltages, and/or using multiple components in parallel to handle greater currents.

Methods

Another aspect of the invention includes a method for switching RF signals, including:
 a. providing at least one RF input port having a shunt switch, a bypass switch, and an in-path connector switch;
 b. coupling each in-path connector switch to an in-circuit path, the in-circuit path being configured to be coupled to an input of a target circuit;
 c. coupling each bypass switch to a switch output port;
 d. coupling each shunt switch to circuit ground;
 e. coupling an isolation shunt switch to the in-circuit path;
 f. providing a switch return path, the switch return path being configured to be coupled to an output of the target circuit;
 g. coupling an output connector shunt switch to the switch return path; and
 h. coupling an output connector switch to the switch return path and to the switch output port.

Yet another aspect of the invention encompasses the first method set forth above, further including configuring an in-circuit mode for a selected RF input port by:
 a. setting the shunt switch and bypass switch for the selected RF input port to an open state, setting the in-path connector switch for the selected RF input port to a closed state, setting the isolation shunt switch to an open state, setting the output connector shunt switch to an open state, and setting the output connector switch to a closed state; and
 b. for each other RF input port, setting the respective in-path connector switch and bypass switch to an open state, and setting the respective shunt switch to a closed state.

Still another aspect of the invention encompasses the first method set forth above, further including configuring a bypass mode for a selected RF input port by:
 a. setting the shunt switch and the in-path connector switch for the selected RF input port to an open state, setting the bypass switch for the selected RF input port to a closed state, setting the isolation shunt switch to a closed state, setting the output connector shunt switch to a closed state, and setting the output connector switch to an open state; and
 b. for each other RF input port, setting the respective in-path connector switch and bypass switch to an open state, and setting the respective shunt switch to a closed state.

Another aspect of the above methods is configuring each bypass switch as a "T" type series/shunt/series circuit, and (a) for an active signal path in the bypass mode, setting a first series switch and a second series switch to a closed state, and setting a shunt switch to an open state; and (b) for an active signal path in the in-circuit mode and for inactive signal paths in either mode, setting the first series switch and the second series switch to an open state, and setting the shunt switch to a closed state.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion. It is to be understood that the foregoing description is intended to illustrate and not to limit the scope of the invention, which is defined by the scope of the following claims, and that other embodiments are within the scope of the claims.

What is claimed is:

1. A radio frequency (RF) signal switch, including:
 (a) at least one first type RF signal port, each first type RF signal port having a shunt switch coupled between the first type RF signal port and circuit ground and configured to selectively shunt the first type RF signal port to ground, a bypass switch coupled between the first type RF signal port and at least one corresponding second type RF signal port, and at least one set of in-path connector switches coupled to the first type RF signal port and the shunt switch;
 (b) at least one in-circuit path each coupled to a corresponding isolation shunt switch and coupled to a corresponding one set of in-path connector switches, each in-circuit path being configured to be coupled to at least one corresponding isolation and/or insertion loss sensitive circuit;
 (c) at least one switch path configured to be coupled to the at least one corresponding isolation and/or insertion loss sensitive circuit, and being coupled to a corresponding port connector shunt switch; and
 (d) at least one port connector switch coupled to a corresponding one switch path and to at least one corresponding second type RF signal port;
 wherein each switch is implemented with at least one field effect transistor.

2. The RF signal switch of claim 1, wherein the RF signal switch is configured in an in-circuit mode for a selected first type RF signal port such that an applied RF signal passing through the selected first type RF signal port passes through only one of the corresponding in-path connector switches for the selected first type RF signal port and through no other switch.

3. The RF signal switch of claim 1, wherein the RF signal switch is configured in a bypass mode for a selected first type RF signal port such that an applied RF signal passes between the selected first type RF signal port and at least one corresponding second type RF signal port through the corresponding bypass switch for the selected first type RF signal port, and each at least one corresponding isolation and/or insertion loss sensitive circuit is isolated from the selected first type RF signal port and the at least one corresponding second type RF signal port.

4. The RF signal switch of claim 1, wherein the RF signal switch is configured in an in-circuit mode for a selected first type RF signal port and the at least one corresponding isolation and/or insertion loss sensitive circuit in which:
   (a) the shunt switch and bypass switch for the selected first type RF signal port are open, at least one set of the in-path connector switches corresponding to one in-circuit path for the selected first type RF signal port is closed, the isolation shunt switch corresponding to such one in-circuit path is open, the port connector shunt switch corresponding to the switch path for the at least one corresponding isolation and/or insertion loss sensitive circuit is open, and the port connector switch corresponding to the switch path for the at least one corresponding isolation and/or insertion loss sensitive circuit is closed; and
   (b) for each other first type RF signal port, the respective in-path connector switches and bypass switch are open, and the respective shunt switch is closed.

5. The RF signal switch of claim 4, further including isolating each isolation and/or insertion loss sensitive circuit corresponding to a non-selected first type RF signal port from each at least one first type RF signal port and each at least one second type RF signal port.

6. The radio frequency (RF) signal switch claim 1, wherein the RF signal switch is configured in a bypass mode for a selected first type RF signal port in which:
   (a) the shunt switch and each set of in-path connector switches for the selected first type RF signal port are open, the bypass switch for the selected first type RF signal port is closed, each isolation shunt switch and each port connector shunt switch is closed, and each port connector switch is open; and
   (b) for each other first type RF signal port, the respective in-path connector switch and bypass switch is open, and the respective isolation shunt switch is closed.

7. The RF signal switch of claim 1, wherein each bypass switch comprises a "T" type series/shunt/series bypass switch circuit.

8. The RF signal switch of claim 7, wherein the "T" type series/shunt/series circuit includes a first series switch coupled at a junction to a second series switch, and a shunt switch coupled to the junction and to circuit ground, wherein (a) for an active first type RF signal port in a bypass mode, the first series switch and second series switch are closed and the shunt switch is open; and (b) for an active first type RF signal port in an in-circuit mode and for inactive first type RF signal ports in either the in-circuit mode or the bypass mode, the first series switch and the second series switch are open and the shunt switch is closed.

9. The RF signal switch of claim 1, wherein each switch is a field effect transistor.

10. The RF signal switch of claim 1, wherein at least one corresponding isolation and/or insertion loss sensitive circuit includes at least one of a low noise amplifier, a digital step attenuator, and/or a matching network.

11. The RF signal switch of claim 1 wherein the RF signal switch and the at least one corresponding isolation and/or insertion loss sensitive circuit are fabricated as a hybrid or monolithic structure.

12. The RF signal switch of claim 11, wherein at least one corresponding isolation and/or insertion loss sensitive circuit includes at least one of a low noise amplifier, a digital step attenuator, and/or a matching network.

13. The RF signal switch of claim 1, wherein there are at least two corresponding second type RF signal ports.

14. A method for switching radio frequency (RF) signals, including:
   (a) providing at least one first type RF signal port, each first type RF signal port having a corresponding shunt switch, a corresponding bypass switch, and a corresponding in-path connector switch;
   (b) for at least one first type RF signal port:
      (1) coupling the corresponding in-path connector switch to a corresponding in-circuit path, the corresponding in-circuit path being coupled to a corresponding isolation shunt switch and configured to be coupled to at least one corresponding isolation and/or insertion loss sensitive circuit;
      (2) coupling the corresponding bypass switch between such first type RF signal port and at least one corresponding second type RF signal port; and
      (3) coupling the corresponding shunt switch to circuit ground, and configuring the corresponding shunt switch to selectively shunt such first type RF signal port to ground;
   (c) for each in-circuit path, providing a corresponding switch path, the corresponding switch path being coupled to a corresponding port connector shunt switch and configured to be coupled to the at least one corresponding isolation and/or insertion loss sensitive circuit;
   (d) for each switch path, coupling a corresponding port connector switch to the switch path and to at least one corresponding second type RF signal port;
wherein each switch is implemented with at least one field effect transistor.

15. The method of claim 14, further including configuring an in-circuit mode for a selected first type RF signal port by:
   (a) opening the corresponding shunt switch and corresponding bypass switch for the selected first type RF signal port, closing the corresponding in-path connector switch for the selected first type RF signal port, opening the corresponding isolation shunt switch for the corresponding in-circuit path, opening the corresponding port connector shunt switch, and closing the corresponding port connector switch; and
   (b) for each other first type RF signal port, opening the corresponding in-path connector switch and the corresponding bypass switch, and closing the corresponding shunt switch.

16. The method of claim 14, further including configuring a bypass mode for a selected first type RF signal port by:
   (a) opening the corresponding shunt switch and the corresponding in-path connector switch for the selected first type RF signal port, closing the corresponding bypass switch for the selected first type RF signal port, closing the corresponding isolation shunt switch for the corresponding in-circuit path, closing the corresponding port connector shunt switch, and opening the corresponding port connector switch; and
   (b) for each other port, opening the corresponding in-path connector switch and the corresponding bypass switch, and closing the corresponding shunt switch.

17. The method of claim 14, wherein each corresponding bypass switch comprises a "T" type series/shunt/series circuit.

18. The method of claim 14, wherein each switch is a field effect transistor.

19. The method of claim 14, wherein the isolation and/or insertion loss sensitive circuit includes at least one of a low noise amplifier, a digital step attenuator, and/or a matching network.

20. The method of claim 14, further including fabricating the RF signal switch and the isolation and/or insertion loss sensitive circuit as a hybrid or monolithic structure.

21. The method of claim 20, wherein the isolation and/or insertion loss sensitive circuit includes at least one of a low noise amplifier, a digital step attenuator, and/or a matching network.

22. The method of claim 14, wherein there are at least two corresponding second type RF signal ports.

\* \* \* \* \*